United States Patent [19]
Fogal

[11] Patent Number: 5,662,261
[45] Date of Patent: Sep. 2, 1997

[54] WIRE BONDING CAPILLARY

[75] Inventor: Rich Fogal, Boise, Id.

[73] Assignee: Micron Technology, Inc., Boise, Id.

[21] Appl. No.: 420,237

[22] Filed: Apr. 11, 1995

[51] Int. Cl.$^6$ ................................................ B23K 20/10
[52] U.S. Cl. ................................ 228/4.5; 228/180.5
[58] Field of Search ............................ 228/4.5, 180.5

[56] References Cited

U.S. PATENT DOCUMENTS

| | | | |
|---|---|---|---|
| 4,415,115 | 11/1983 | James | 228/180.5 |
| 4,886,200 | 12/1989 | Tsumura | 228/1.1 |
| 5,003,373 | 3/1991 | Tsumuru et al. | 357/67 |
| 5,172,851 | 12/1992 | Matsushita et al. | 228/179 |
| 5,421,503 | 6/1995 | Perlberg et al. | 228/4.5 |

FOREIGN PATENT DOCUMENTS

| | | | |
|---|---|---|---|
| 59-191338 | 10/1984 | Japan | 228/4.5 |
| 1-273325 | 11/1989 | Japan | 228/180.5 |

OTHER PUBLICATIONS

"Thermosonic Capillaries For Fine Pitch Bonding," Small Precision Tools, Petaluma, California, 1988.

*Primary Examiner*—P. Austin Bradley
*Assistant Examiner*—Jeffrey T. Knapp
*Attorney, Agent, or Firm*—Ormiston Korfanta Dunbar & Holland

[57] ABSTRACT

A multiple face angle wire bonding capillary of the present invention has an elongated hole therethrough terminating at one end of the capillary tip, and a face on the end of the capillary tip extending away from the hole at multiple angles of increasing magnitude.

20 Claims, 3 Drawing Sheets

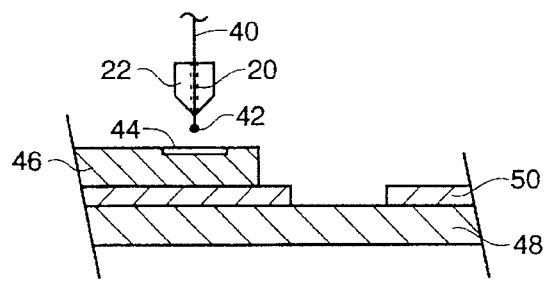 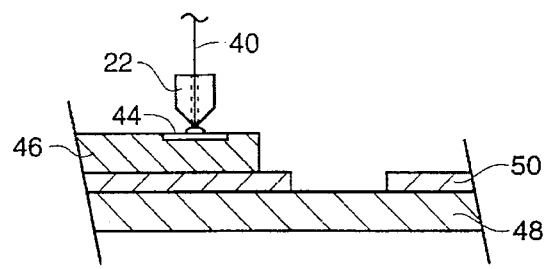
FIG. 2  FIG. 3
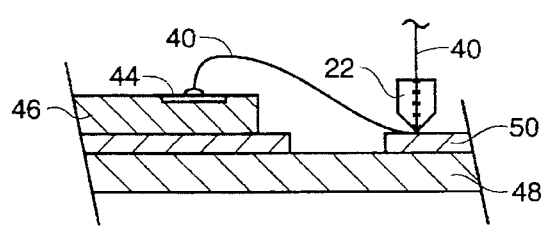 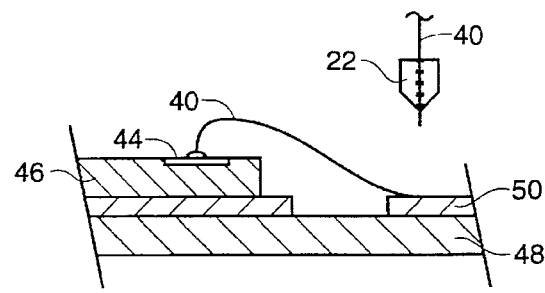
FIG. 4  FIG. 5

WIRE BONDING CAPILLARY

FIELD OF THE INVENTION

The invention relates to semiconductor manufacturing and, more particularly, to an improved wire bonding capillary.

BACKGROUND OF THE INVENTION

In semiconductor manufacture, a wire bonding process is used to electrically connect metal bond pads formed on a semiconductor die to the leadfingers of a leadframe. Wire bonding devices are well known in the art. U.S. Pat. Nos. 3,894,671 issued to Kulicke Jr et al., 4,877,173 issued to Fujimoro et al., and 5,082,154 issued to Ishizuka illustrate known bonding devices.

The wire bonding process occurs during the final stages of manufacture when the semiconductor device is enclosed within a sealed package. Although a variety of different packaging systems are used in the semiconductor industry, most systems include a leadframe on which the die is mounted, leadfingers, bond wires electrically connecting the leadfingers to a metal bond pad on the die, and a sealed package enclosing the various components. Initially, numerous dies are mounted on the leadframe. The metal bond pads formed on the surface of each die are connected to the leadfingers on the leadframe using a very thin wire. The dies are then enclosed within a sealed package. A portion of the leadfingers extend out through the package for connection to an external circuit. A trim and form operation is used to separate each die package and to bend the protruding leadfingers into the proper configuration.

During the wire bonding process, a heat block heats the die and the leadframe to a temperature of about 150° C. to 350°. A bonding capillary tool mechanically presses the wire against a bond pad on the die and then to a bonding site on the appropriate leadfinger. The bond wire is threaded through the bonding capillary. The end of the wire is then heated by an electrical discharge or a hydrogen torch to a molten state, thus forming a ball of molten metal on the end of the bond wire. The molten ball is pressed by the bonding capillary against the heated bond pad, sometimes in combination with ultrasonic vibration, to alloy the metallic elements of the wire and the metal bond pad and thereby bond the wire to the pad. The bonding capillary tool is then moved to a bonding site on the appropriate leadfinger. The wire is pressed against the heated leadfinger to bond the wire to the leadfinger. The bond wire is then tensioned and sheared. The process is repeated for each bond pad on the die.

The present invention is directed in general to an improved wire bonding capillary and, more specifically, to an improved capillary tip. It has been discovered that by incorporating multiple angles into the face of the capillary tip, the strength of the wire bond to the leadfinger is improved.

SUMMARY OF THE INVENTION

Therefore, it is one object of the invention to improve the strength of the wire/leadfinger bonds formed during the manufacture of semiconductor devices. According to the present invention, these and other objects are achieved by a wire bonding capillary that comprises a capillary tip having an elongated hole therethrough terminating at one end of the capillary tip, and a face on the end of the capillary tip extending away from the hole at multiple angles. The largest face angle should be no greater than 15°. One embodiment of the invention utilizes a double face angle, wherein the face extends away from the hole at a first angle for a first distance and then at a second angle for a second distance, at which point the face joins the outer surface of the capillary tip.

In another embodiment of the invention the capillary tip includes a cone shaped outer surface; an elongated hole having a circular cross-section, the hole being characterized by a substantially vertical sidewall disposed within the capillary tip; a face on one end of the capillary tip, the face having a plurality of flat surfaces beveled at multiple angles; and a cone shaped inner transition surface connecting the sidewall and the face. The face extends away from the inner transition surface to the outer surface of the capillary tip.

Additional objects, advantages and novel features of the invention will be set forth in part in the description that follows, and in part will become apparent to those skilled in the art upon examination of the following or may be learned by practice of the invention.

BRIEF DESCRIPTION OF THE DRAWINGS

FIGS. 2–5 are cross sectional views showing the steps of a typical wire bonding operation.

DETAILED DESCRIPTION

Figure 1:
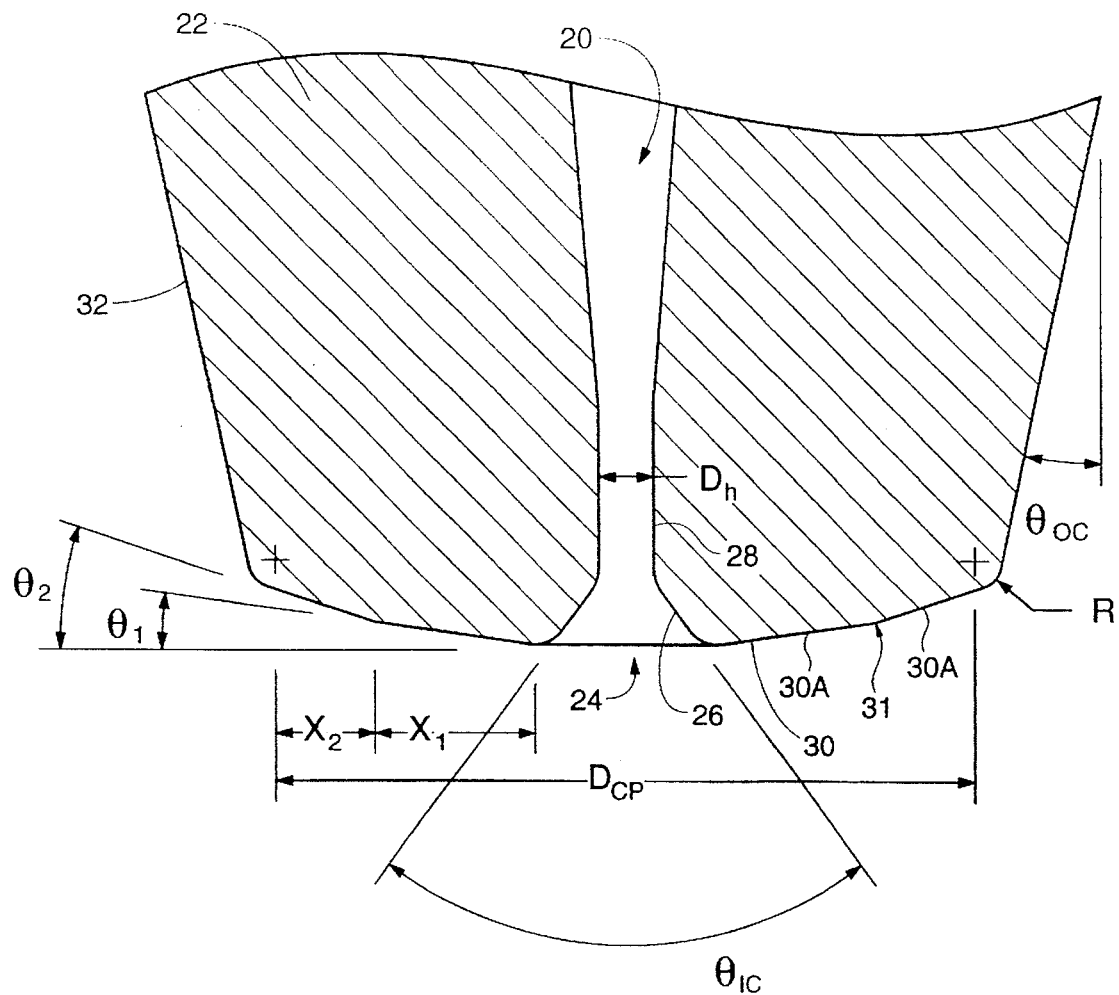
FIG. 1 is a cross sectional view of a capillary tip configured according to the preferred embodiment of the invention.

Referring to FIG. 1, hole 20 extends through capillary tip 22. Hole 20 terminates in opening 24 at the bottom of capillary 22. Opening 24 is characterized by inner transition surface 26 which connects sidewall 28 of hole 20 and face 30. Inner transition surface 26 is shown in FIG. 1 as a flat surface beveled at a single angle. As is known in the art, however, inner transition surface 26 may be a plurality of flat conical surfaces beveled at multiple angles or a convex surface. Hole 20 preferably has a uniform diameter near opening 24 and a slightly tapered expanding diameter in the upper portions of capillary tip 22.

Face 30 extends away from inner transition surface 26 at a first angle $\theta_1$ for a first distance $x_1$, and then at a second angle $\theta_2$ for a second distance $x_2$ at which point face 30 joins outer surface 32 of capillary tip 22. A curved transition, having a radius R, between face 30 and outer surface 32 is preferred. Although only two face angles, $\theta_1$ and $\theta_2$, are shown, more than two angles may be used. The distance, x, over which each angle extends is not critical and may vary along each angle. The largest face angle, generally designated $\theta_n$ for multiple face angles $\theta_1, \theta_2 \ldots \theta_n$, should not exceed 15° with respect to horizontal. The vertices 31 at each change in angle of bevel are distinct as a result of flat surfaces 30a intersecting.

The particular dimensions of the features of the capillary tip described above will vary depending on the particular wire bonding operation. For a typical semiconductor memory chip wire bonding operation utilizing a wire having a nominal diameter of 0.0012 inches, the capillary tip of the preferred embodiment of the invention will have the following approximate dimensions: the diameter $D_{cp}$ of capillary tip 22 at face 30 is 0.0165 inches; the diameter $D_h$ of hole 20 near opening 24 is 0.0018 inches; the inner cone angle $\theta_{ic}$ is 90°; the outer cone angle $\theta_{oc}$ is 20°; the first face angle $\theta_1$ is 8°; the first distance $x_1$ is 0.004 inches; the second face angle $\theta_2$ is 11°; the second distance $x_2$ is 0.004 inches; and the transition radius R is 0.0008 inches.

A typical wire bonding operation using the capillary tip of the present invention will now be described with reference to FIGS. 2–5. Referring first to FIG. 2, wire 40, commonly made of gold or copper, is threaded through hole 20 in capillary tip 22. The end of wire 40 is heated by an electrical discharge or a hydrogen torch to a molten state, thus forming a ball 42 of molten metal on the end of wire 40. Capillary tip 22 is lowered toward bond pad 44 which has been formed on the surface of semiconductor die 46, as shown in FIG. 3. Bond pad 44 is typically made of aluminum, but any suitable conductive material may be used. Die 46 is heated to a temperature of 150° C. to 350° C. by heat block 48. Molten ball 42 is pressed by capillary tip 22 against the heated bond pad 44 to alloy the metallic elements of wire 40 and bond pad 44 and thereby bond the wire to the pad. In some bonding operations, ultrasonic vibrations are applied to capillary tip 22 as the molten ball 42 is pressed against bond pad 44.

Referring now to FIG. 4, capillary tip 22 is then raised, causing wire 40 to feed through capillary tip 22, and moved to a bonding site on leadfinger 50. Leadfinger 50 is heated to a temperature of 150° C. to 350° by heat block 48. Wire 40 is pressed against the heated leadfinger 50 to alloy the metallic elements of wire 40 and leadfinger 50 and thereby bond the wire to the leadfinger. Again, ultrasonic vibrations may be applied to capillary tip 22 as wire 40 is pressed against leadfinger 50. Following attachment of wire 40 to leadfinger 50, the bonding tool severs wire 40 as shown in FIG. 5. The process is repeated for each bond pad on the die.

Figure 6:
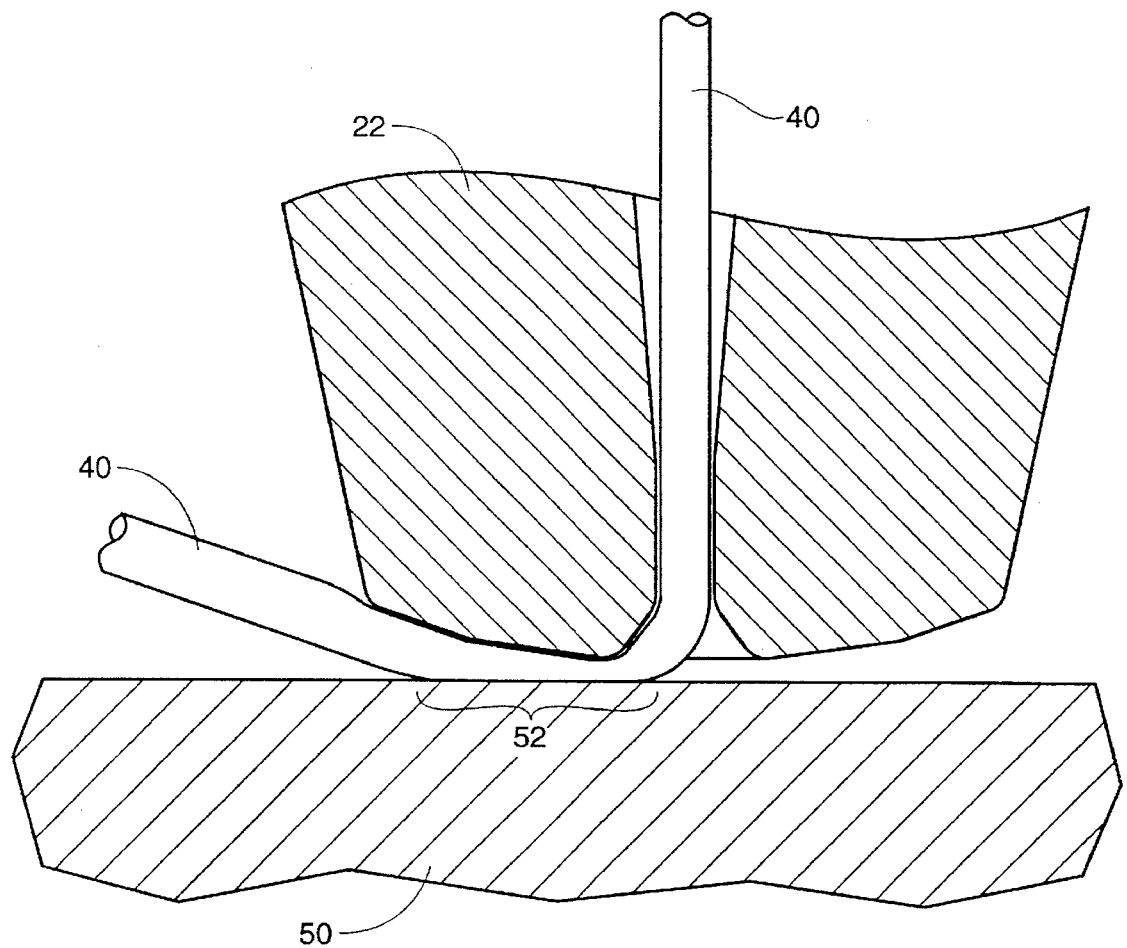
FIG. 6 is an expanded cross sectional view showing a wire/leadfinger connection formed using a capillary tip configured according to the preferred embodiment of the invention.

FIG. 6 is an expanded view showing the wire/leadfinger connection as the capillary tip presses the wire against the leadfinger. It bas been observed that the use of multiple face angles as described above improves the bond strength of the bond between the wire and the leadfinger. Although the exact mechanism through which bond strength is improved is not known, it is believed that the multiple face angles result in a longer bond area 52 and a more gradual transition between the wedge deformity of wire 40 and the natural shape the wire.

The invention has been described in terms of a preferred embodiment. It is intended, however, that alternate embodiments of the inventive concepts expressed herein be included within the scope of the following claims.

I claim:

1. A wire bonding capillary, which comprises:
   a. a capillary tip having an elongated hole therethrough, the hole terminating at one end of the capillary tip; and
   b. a face on the end of the capillary tip extending away from the hole at multiple angles of increasing magnitude as measured upward from a reference that is perpendicular to the longitudinal axis of the hole, wherein a distinct vertex is formed at each change in angle.

2. A wire bonding capillary, which comprises:
   a. a capillary tip having an elongated hole therethrough, the hole terminating at one end of the capillary tip; and
   b. a face on the end of the capillary tip extending away from the hole, the face comprising a plurality of flat surfaces beveled at multiple angles.

3. A wire bonding capillary, which comprises:
   a. a capillary tip having an elongated hole therethrough, the hole terminating at one end of the capillary tip; and
   b. a face on the end of the capillary tip extending away from the hole at multiple angles of increasing magnitude as measured upward from a reference that is perpendicular to the longitudinal axis of the hole, the largest angle being no greater than 15°.

4. A wire bonding capillary, which comprises:
   a. a capillary tip having an elongated hole therethrough, the hole terminating at one end of the capillary tip; and
   b. a face on the end of the capillary tip extending away from the hole at a first angle for a first distance and then at a second angle greater in magnitude than the first angle, as measured upward from a reference that is perpendicular to the longitudinal axis of the hole, for a second distance, at which point the face joins an outer surface of the capillary tip.

5. A wire bonding capillary, which comprises a capillary tip having an elongated hole therethrough terminating in an opening at one end of the capillary tip, the hole being characterized by a sidewall within the capillary tip, the opening being characterized by an inner transition surface connecting the sidewall and a face on the end of the capillary tip, the face extending away from the inner transition surface at multiple angles of increasing magnitude as measured upward from a reference that is perpendicular to the longitudinal axis of the hole, wherein a distinct vertex is formed at each change in angle.

6. A wire bonding capillary, which comprises:
   a. a capillary tip having an elongated hole therethrough terminating in an opening at one end of the capillary tip, the hole being characterized by a sidewall within the capillary tip, the opening being characterized by an inner transition surface connecting the sidewall and a face on the end of the capillary tip, the face extending away from the inner transition surface at multiple angles of increasing magnitude as measured upward from a reference that is perpendicular to the longitudinal axis of the hole; and
   b. wherein the largest angle is no greater than 15°.

7. A wire bonding capillary, which comprises:
   a. a capillary tip having an elongated hole therethrough terminating in an opening at one end of the capillary tip the hole being characterized by a sidewall within the capillary tip, the opening being characterized by an inner transition surface connecting the sidewall and a face on the end of the capillary tip, the face extending away from the inner transition surface at multiple angles of increasing magnitude as measured upward from a reference that is perpendicular to the longitudinal axis of the hole; and
   b. wherein the face comprises a plurality of flat surfaces beveled at multiple angles.

8. A wire bonding capillary according to claim 7, wherein the face extends away from the hole at a first angle for a first distance and then at a second angle greater in magnitude than the first angle for a second distance, at which point the face joins an outer surface of the capillary tip.

9. A wire bonding capillary, which comprises:
   a. a capillary tip having a cone shaped outer surface;
   b. an elongated hole having a circular cross-section, the hole being characterized by a substantially vertical sidewall disposed within the capillary tip;
   c. a face on one end of the capillary tip, the face having a plurality of flat surfaces beveled at multiple angles of increasing magnitude as measured upward from a reference that is perpendicular to the longitudinal axis of the hole; and d. a cone shaped inner transition surface connecting the sidewall and the face.

10. A wire bonding capillary according to claim 9, wherein the face extends away from the hole at a first angle for a first distance and then at a second angle greater in magnitude than the first angle for a second distance, at which point the face joins an outer surface of the capillary tip.

11. A wire bonding capillary according to claim 10, wherein the first angle is 8° and the second angle is 11°.

12. A wire bonding capillary according to claim 9, wherein the face extends away from the inner transition surface to the outer surface of the capillary tip.

13. A wire bonding capillary according to claim 12, wherein the outer surface of the capillary tip is tapered outward from the face at an angle of about 20° measured with respect to a vertical reference.

14. A wire bonding capillary, which comprises:

a. a capillary tip having an elongated hole therethrough, the hole terminating at one end of the capillary tip; and b. a face on the end of the capillary tip extending away from the hole at multiple angles, wherein a distinct vertex is formed at each change in angle.

15. A wire bonding capillary according to claim 1, further comprising an outer transition surface joining the face and an outer surface of the capillary tip.

16. A wire bonding capillary according to claim 15, wherein the outer transition surface is a curved surface.

17. A wire bonding capillary according to claim 1, wherein the hole is characterized by a sidewall within the capillary tip and the capillary further comprising an inner transition surface connecting the sidewall and the face.

18. A wire bonding capillary according to claim 17, wherein the inner transition surface is a conical flat surface beveled at a single angle.

19. A wire bonding capillary according to claim 17, wherein the inner transition surface comprises a plurality of flat conical surfaces beveled at multiple angles.

20. A wire bonding capillary according to claim 17, wherein the inner transition surface is convex.

* * * * *